United States Patent
Tan et al.

(10) Patent No.: US 7,310,020 B2
(45) Date of Patent: Dec. 18, 2007

(54) SELF-BIASED PHASED-LOCKED LOOP

(75) Inventors: Swee Boon Tan, Penang (MY); Keng L. Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 11/321,495

(22) Filed: Dec. 29, 2005

(65) Prior Publication Data

US 2007/0152760 A1    Jul. 5, 2007

(51) Int. Cl.
*H03L 7/00* (2006.01)
*H03L 7/099* (2006.01)

(52) U.S. Cl. ................ 331/16; 331/17; 331/25; 331/185; 327/157

(58) Field of Classification Search ........... 331/16, 331/17, 28, 25, 1 A, 185; 327/156, 157
See application file for complete search history.

(56) References Cited

U.S. PATENT DOCUMENTS

| | | | | |
|---|---|---|---|---|
| 5,900,784 | A * | 5/1999 | O'Sullivan | 331/2 |
| 6,329,882 | B1 * | 12/2001 | Fayneh et al. | 331/10 |
| 6,646,512 | B2 | 11/2003 | Abassi et al. | |
| 6,710,670 | B2 | 3/2004 | Maneatis | |
| 6,747,497 | B2 * | 6/2004 | Ingino, Jr. | 327/157 |
| 2004/0239354 | A1 * | 12/2004 | Knoll et al. | 324/760 |

OTHER PUBLICATIONS

Maneatis, John G., "FA 8.1: Low-Jitter and Process-Independent DLL and PLL Based on Self Biased Techniques", *1996 IEEE International Solid-State Conference*, (1996),3 pages.
Maneatis, John G., "Hidden Complexities of PLLs are Revealed", *Feature Article in Jan. 2002 Issue of ISD Magazine*, (Jan. 2002),5 pages.
Maneatis, John G., "Low-Jitter Process-Independent DLL and PII Based on Self-Biased Techniques", *IEEE Journal of Solid-State Circuits*, vol. 13, No. 11, (Nov. 1996),1723-1732.

(Continued)

*Primary Examiner*—Robert Pascal
*Assistant Examiner*—Ryan J Johnson
(74) *Attorney, Agent, or Firm*—Douglas J. Ryder; Ryder IP Law

(57) ABSTRACT

In general, in one aspect, the disclosure describes a phase-locked loop circuit. The circuit includes an oscillator having a first control input, a second control input, and a third control input, wherein the first control input, the second control input, and the third control input act to control output frequency of the oscillator. The circuit further includes a first charge pump and a second charge pump. A first bias generator is coupled to the first control input of the oscillator and can receive electrical input from the first charge pump. A second bias generator is coupled to the second control input of the oscillator and can receive electrical input from the first charge pump, the second charge pump, and the first bias generator. A third bias generator is coupled to the third control input of the oscillator and can receive electrical input from the second charge pump and the first bias generator.

24 Claims, 8 Drawing Sheets

OTHER PUBLICATIONS

Maneatis, John G., "Self-Biased High-Bandwidth Low-Jitter 1-to-4096 Multiplier Clock Generator PLL", *IEEE Journal of SOlid-State Circuits*, vol. 38, No. 11, (Nov. 2003),1795-1803.

Maneatis, John G., "Self-Biased High-Bandwidth Low-Jitter 1-to-4096 Multiplier Clock Generator PLL", 688-690.

Tan, Swee Boon, et al., "Self-Biased Phased-Locked Loop", filed May 31, 2005; Serial No. 11/140,684, 21 pgs.

* cited by examiner

SELF-BIASED PHASED-LOCKED LOOP

BACKGROUND

The phase-locked loop (PLL) is a versatile electronic circuit used in a wide variety of applications, including frequency synthesis, clock recovery, clock multiplication, and clock regeneration. In large, high-speed integrated circuits (including application-specific integrated circuits, field-programmable gate arrays, network processors, and general purpose microprocessors), PLLs have become commonplace. On-chip PLL clock multipliers are used on these chips to generate a high-frequency clock signal that is a multiple of, and in phase with, a system clock or input/output (I/O) clock. PLLs may also be used on these chips to resynchronize and realign clocks in deep clock distribution trees to reduce clock skew.

FIG. 1 illustrates an example block diagram of a PLL 100. The PLL 100 includes a phase-frequency detector (PFD) 110, a charge pump (CP) 120, a filter (e.g., low pass filter (LPF)) 130, and an oscillator 140. The output frequency of the oscillator 140 is controlled by one or more input control signals. In operation, the PLL 100 adjusts the oscillator 140 to match (in both frequency and phase) a reference input 160. The PLL 100 may also include a divider 150 on a feedback loop from the oscillator 140 to the PFD 110. The divider 150 takes PLL output 165 and divides it by N so that the divided signal 170 is compared to the reference input. This enables the PLL output 165 to be N times higher in frequency than the reference input 160, allowing the PLL 100 to perform frequency multiplication.

A self-biased PLL (SBPLL) is used to create on-chip PLLs that have low jitter and are relatively insensitive to integrated circuit process variations, supply voltage and operating temperature (PVT). However, a major weakness of the SBPLL is that the oscillator output is subject to amplitude variability and common mode disturbances during dynamic operation of the PLL (e.g., acquisition, locking). In particular, operational correction can lead to the front-end oscillator amplifier and the following amplifying stages (the so-called "post-oscillator amplifiers") being biased out of their optimal range (sweet spot), causing pulse evaporation (truncation, or dropped output clocks) and functional failure. This problem manifests as a non-monotonic oscillator control surface (output frequency versus control inputs) which may lead to one or more of the following: long lock time or lock failure due to positive feedback, sensitivity to power supply noise, and functional sensitivity to large reference and/or feedback clock noise.

BRIEF DESCRIPTION OF THE DRAWINGS

The features and advantages of the various embodiments will become apparent from the following detailed description in which.

DETAILED DESCRIPTION

Figure 1:
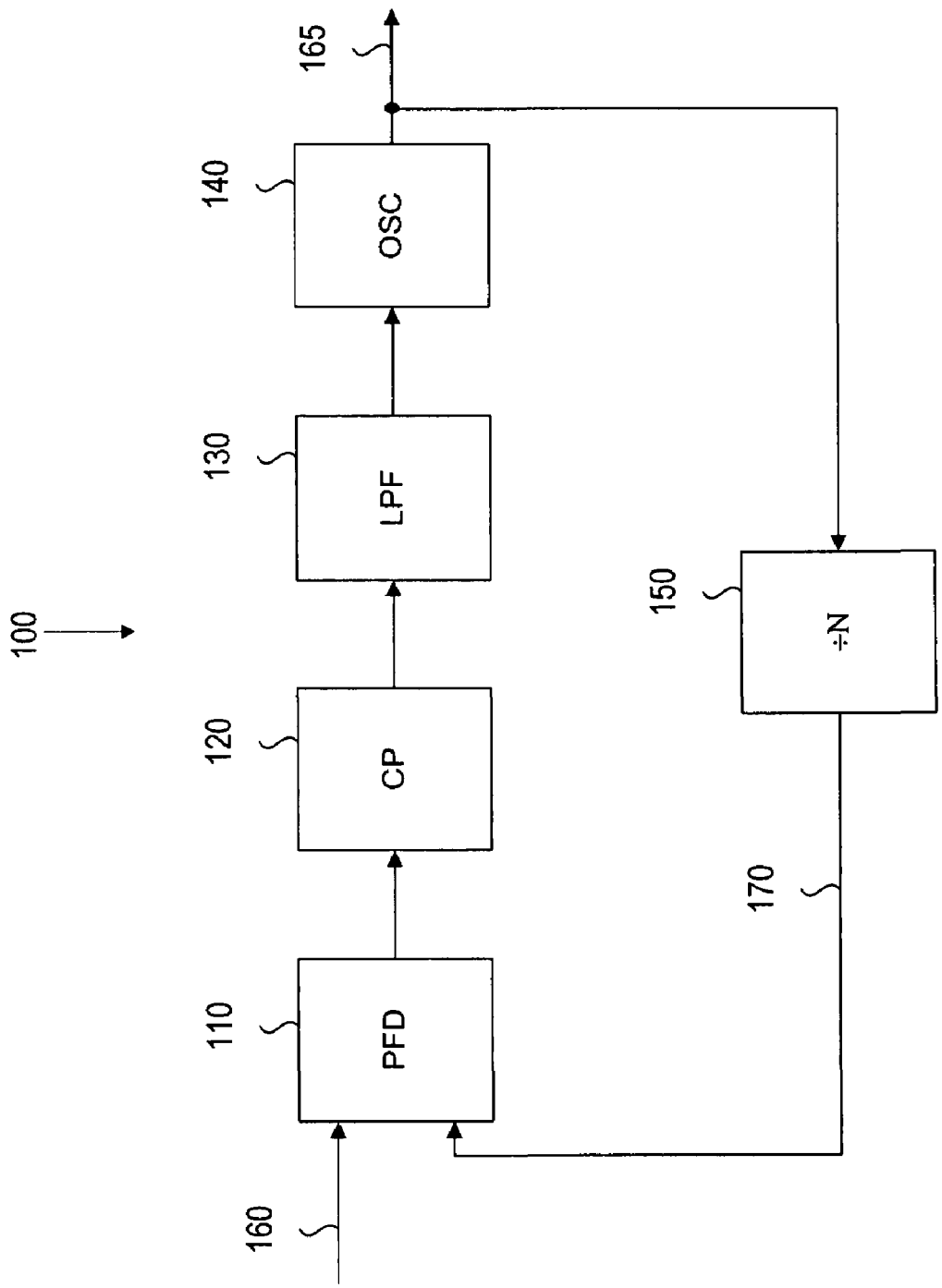
FIG. 1 illustrates an example phase-locked loop (PLL) circuit, according to one embodiment.
Figure 2:
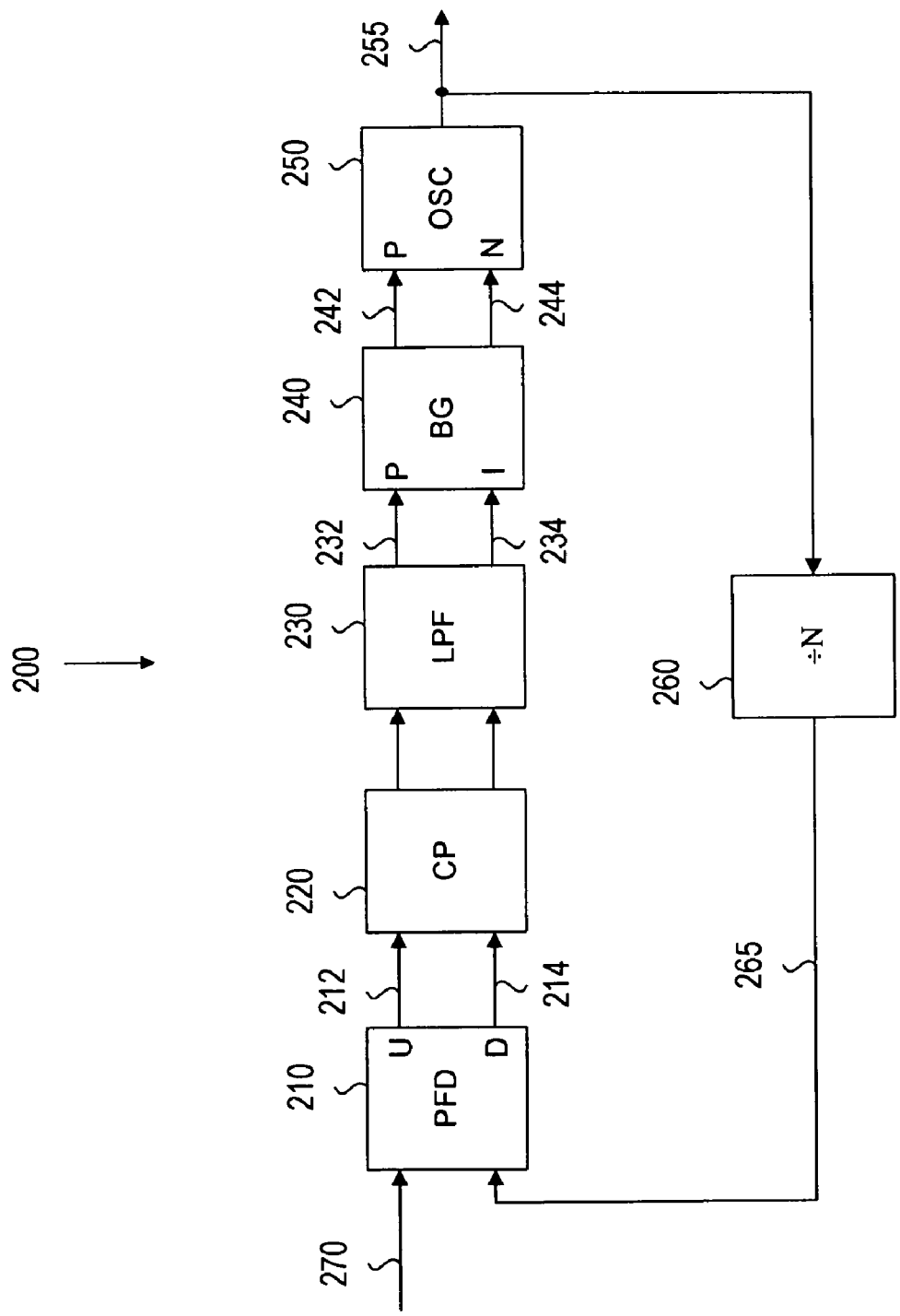
FIG. 2 illustrates an example self-biased PLL (SBPLL) circuit, according to one embodiment.

FIG. 2 illustrates an example self-biased phase-locked loop (SBPLL) 200. The SBPLL 200 includes a phase-frequency detector (PFD) 210, a charge pump (CP) 220, a filter (e.g., LPF) 230, a bias generator (BG) 240, and an oscillator 250, and may include a divider 260. The output frequency of the oscillator 250 is controlled by one or more control inputs. The control inputs may be voltages and the oscillator 250 may be a voltage controlled oscillator (VCO)). Alternatively, the control inputs may be currents or some combination of currents and voltages and the oscillator 250 may be current controlled or current/voltage controlled.

The SBPLL 200 uses negative feedback to adjust the oscillator 250 such that the frequency of an oscillator output 255 or a divided oscillator output 265 matches (in both frequency and phase) a reference input 270. The PFD 210 compares the frequency and phase difference between the reference signal 270 and the oscillator/divided oscillator output 255/265 and generates one or more output signals based on this difference. As illustrated, the PFD 210 may generate an UP signal 212 or a DOWN signal 214. The PFD 210 generates UP signals 212 when the frequency (phase) of the oscillator/divided oscillator output 255/265 is lower than (lags) the reference signal 270. The PFD 210 generates DOWN signals 214 when the frequency (phase) of the oscillator/divided oscillator output 255/265 is higher than (leads) the reference signal 270. The UP and DOWN signals (charge pulses) 212, 214 generated are based on the amount of lag or lead respectively. The CP 220 and the LPF 230 smooth and condition the pulses from the PFD 210 and generate two control signals, a proportional control signal 232 and an integrating control signal 234.

The integrating control signal 234 represents the net accumulated (integrated) charge from the previously generated UP signals 212 and DOWN signals 214. The integrating control signal 234 also represents the dominant pole of the transfer function for the PLL 200. The proportional control signal 232 represents, more directly, the instantaneous UP signals 212 and DOWN signals 214. The proportional control 232 also represents the zero of the transfer function for the PLL 200. The proportional control signal 232 and the integrating control signal 234 are fed to the BG 240. The BG 240 processes these signals and generates control/bias signals, PBias 242 and NBias 244.

Figure 3:
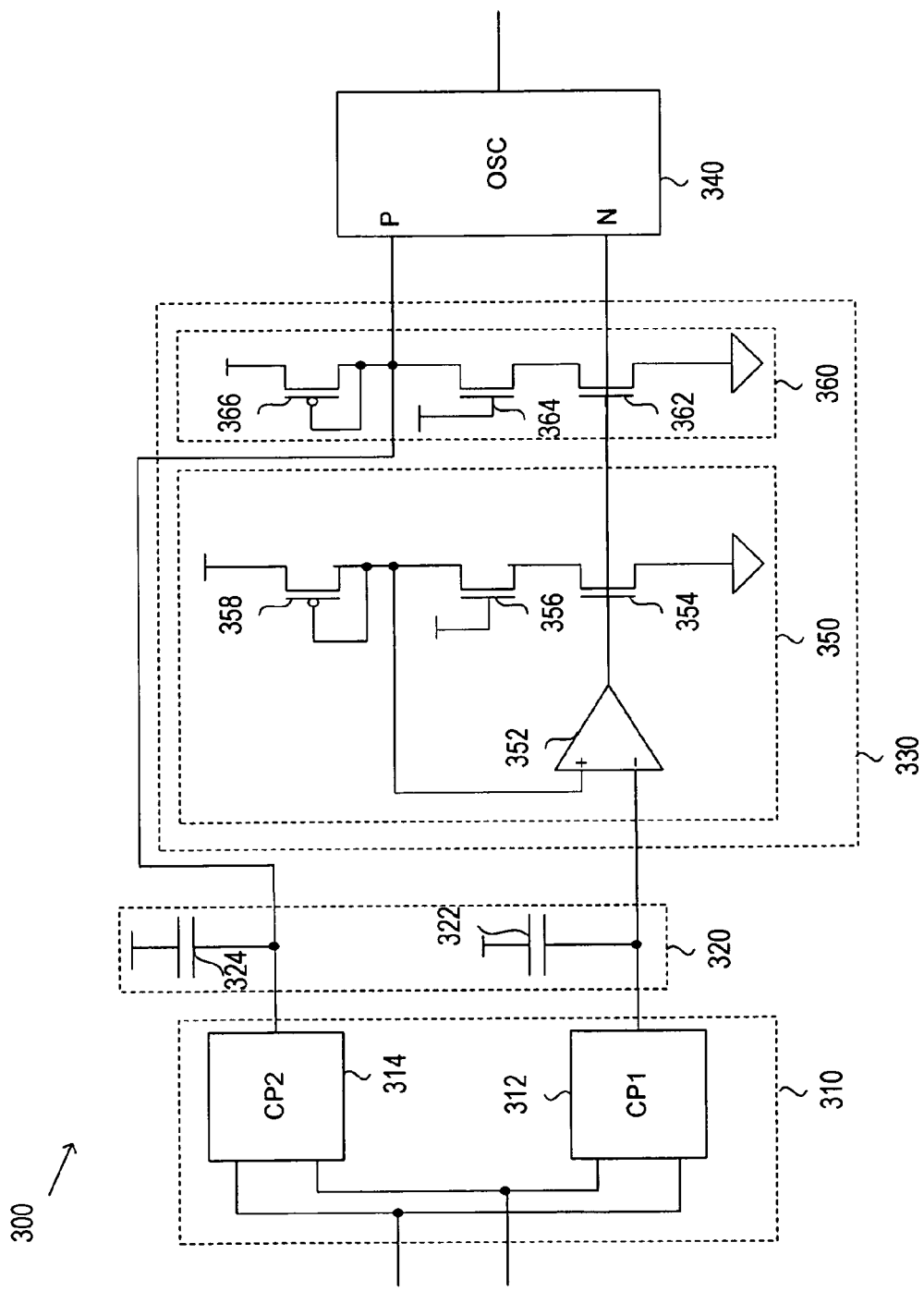
FIG. 3 illustrates a schematic of an example SBPLL, according to one embodiment.

FIG. 3 illustrates a schematic of an example SBPLL 300. The SBPLL 300 includes a charge pump 310 (e.g., 220 of FIG. 2), a filter 320 (e.g., 230), a bias generator 330 (e.g., 240), and an oscillator 340 (e.g., 250). The charge pump 310 includes an integrating charge pump (CP1) 312 for generating an integrating control signal and a proportional charge pump (CP2) 314 for generating a proportional control signal. The filter 320 includes capacitors 322, 324 to filter the integrating control signal and the proportional control signal respectively.

The bias generator 330 includes an NBias generator 350 and a PBias generator 360 to generate NBias and PBias signals for the oscillator 340 respectively. The NBias generator 350 includes an operational amplifier 352 and transistors 354, 356, and 358 connected in series. According to one embodiment, the transistors 354 and 356 may be NMOS FETs and the transistor 358 may be a PMOS FET connected as a diode. The integrating control signal from CP1 312 is provided to the NBias generator 350 as one input of the operational amplifier 352. A second input of the operational amplifier 352 is an output from the transistors 354, 356, and 358. An output of the amplifier 352 is provided to a gate of the transistor 354. The amplifier output is a biased integrating control signal and is an output of the NBias generator 350. The NBias output is provided to an "N" input of the oscillator 340.

The PBias generator 360 includes transistors 362, 364, and 366 connected in series. According to one embodiment, the transistors 362 and 364 may be NMOS FETs and the transistor 366 may be a PMOS FET connected as a diode. The NBias output is provided to a gate of the transistor 362. The proportional control signal from the CP2 314 is provided to the PBias generator 360 and may be biased by the transistors 362, 364, and 366. The biased proportional control signal is an output of the PBias generator 360 and is provided to a "P" input of the oscillator 340.

The use of the NBias output (the biased proportional control signal) in the PBias generator 360 provides some amount of biasing balance in the oscillator oscillatory signals. However, the proportional control signal is fed only to the "P" input of the oscillator 340. This tends to unbalance the oscillator bias during transitions in the proportional control. In fact, the oscillator 340 may act as a common mode amplifier to the "P" input, causing common mode shift and amplitude shrink in oscillator output, and stress to the post-oscillator path. Common mode shift and amplitude shrink in the oscillator output manifests as a non-monotonic oscillator control surface (output frequency versus control inputs). A non-monotonic oscillator control surface may lead to one or more of the following: pulse evaporation (truncation, or dropped output clocks), long lock time or lock failure due to positive feedback, sensitivity to power supply noise, and functional sensitivity to large reference and/or feedback clock noise.

Figure 4:
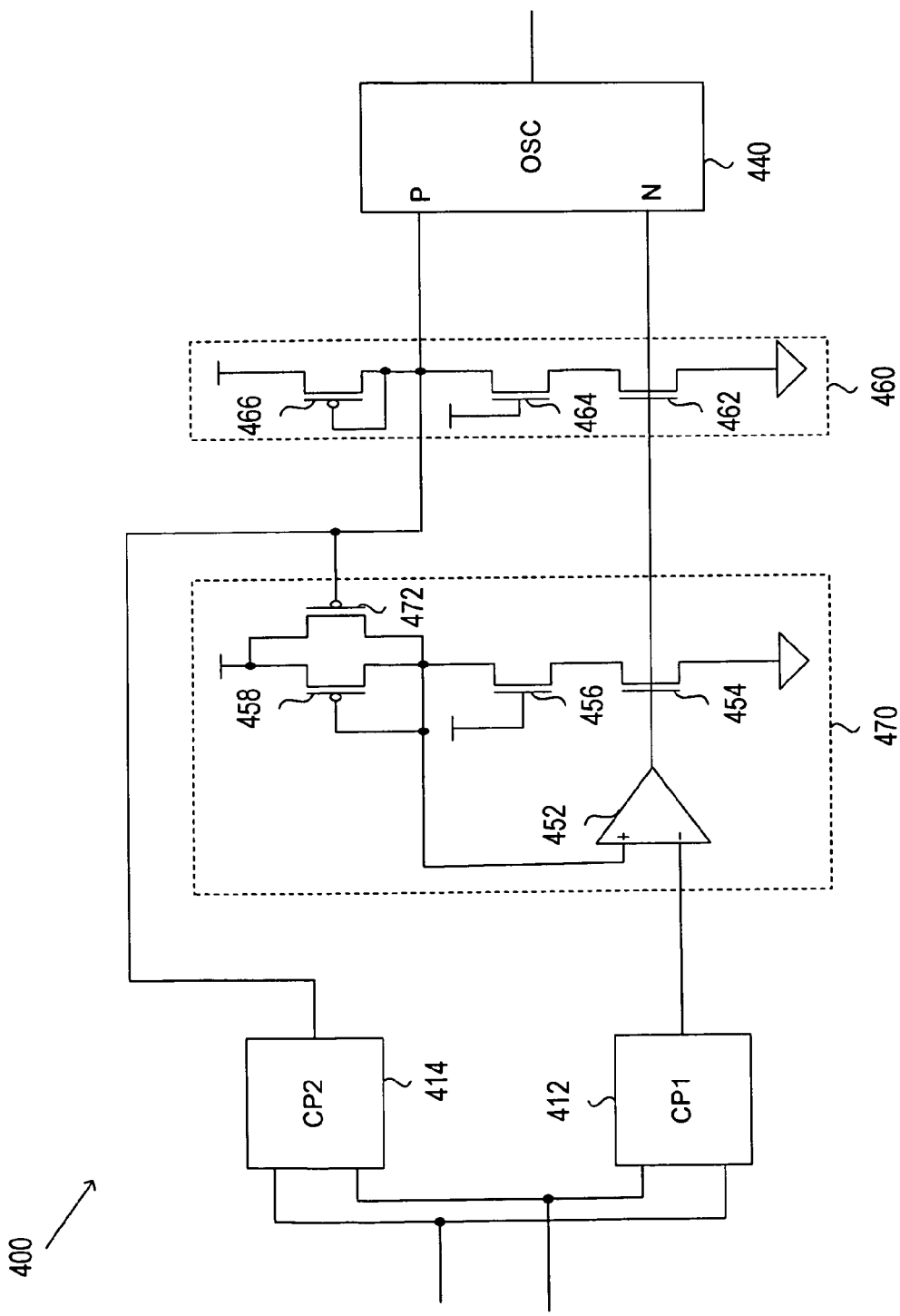
FIG. 4 illustrates a simplified schematic of an example SBPLL for reducing the oscillator common mode gain, according to one embodiment.

FIG. 4 illustrates a schematic of an example SBPLL 400 for reducing the oscillator common mode gain. The SBPLL 400 is similar to the SBPLL 300 in that it includes an integrating charge pump (CP1) 412 (e.g., 312), a proportional charge pump (CP2) 414 (e.g., 314), a filter (not illustrated), an NBias generator 470, a PBias generator 460 (e.g., 360) and an oscillator 440 (e.g., 340).

The NBias generator 470 includes an operational amplifier 452 (e.g., 352), transistors 454, 456, 458 (e.g., 354, 356, 358) and a transistor 472 (coupling transistor) in parallel to the transistor 458. The transistor 472 receives the proportional control signal from the CP2 414, which provides a modified feedback path from the CP2 414 to the "N" input of the oscillator 440. The modified feedback reduces the oscillator common mode gain. The modified feedback path transfers a portion of the proportional control signal to the "N" input of the oscillator 440 via the NBias generator 470. The proportional control signal is added in a direction, and with an amplitude, that minimizes the oscillator 440 signal attenuation to stabilize the common mode amplification. The portion of the proportional control signal coupled into the NBias generator 470 may be determined by a ratio of the number of coupling transistors to the total number of coupling transistors and diode-connected transistors (acting as resistive elements). As illustrated in FIG. 4, the portion of the proportional control signal coupled into the NBias generator 470 is approximately 50% based on the use of one coupling transistor 472 and one diode-connected transistor 458 (1 coupling divided by total of 2 (1 coupling plus 1 diode)).

The feedback of the proportional control signal from the CP2 414 into the NBias generator 470 stabilizes the behavior of the oscillator 440 during a perturbation in the phase-locked loop. During an event where the output of the CP2 414 drops to a lower voltage, the oscillator 440 increase in frequency is accompanied by stable output common mode with little attenuation. However, the NBias signal provided to the N input of the oscillator 440 may not allow the use of significant decoupling because a large decoupling capacitor connected to the NBias signal would slow the propagation delay of the proportional control (zero), leading to a higher than desired loop damping factor and possible loop stability problems. Not enabling decoupling of the NBias signal may result in instability of the SBPLL 400.

Figure 5:
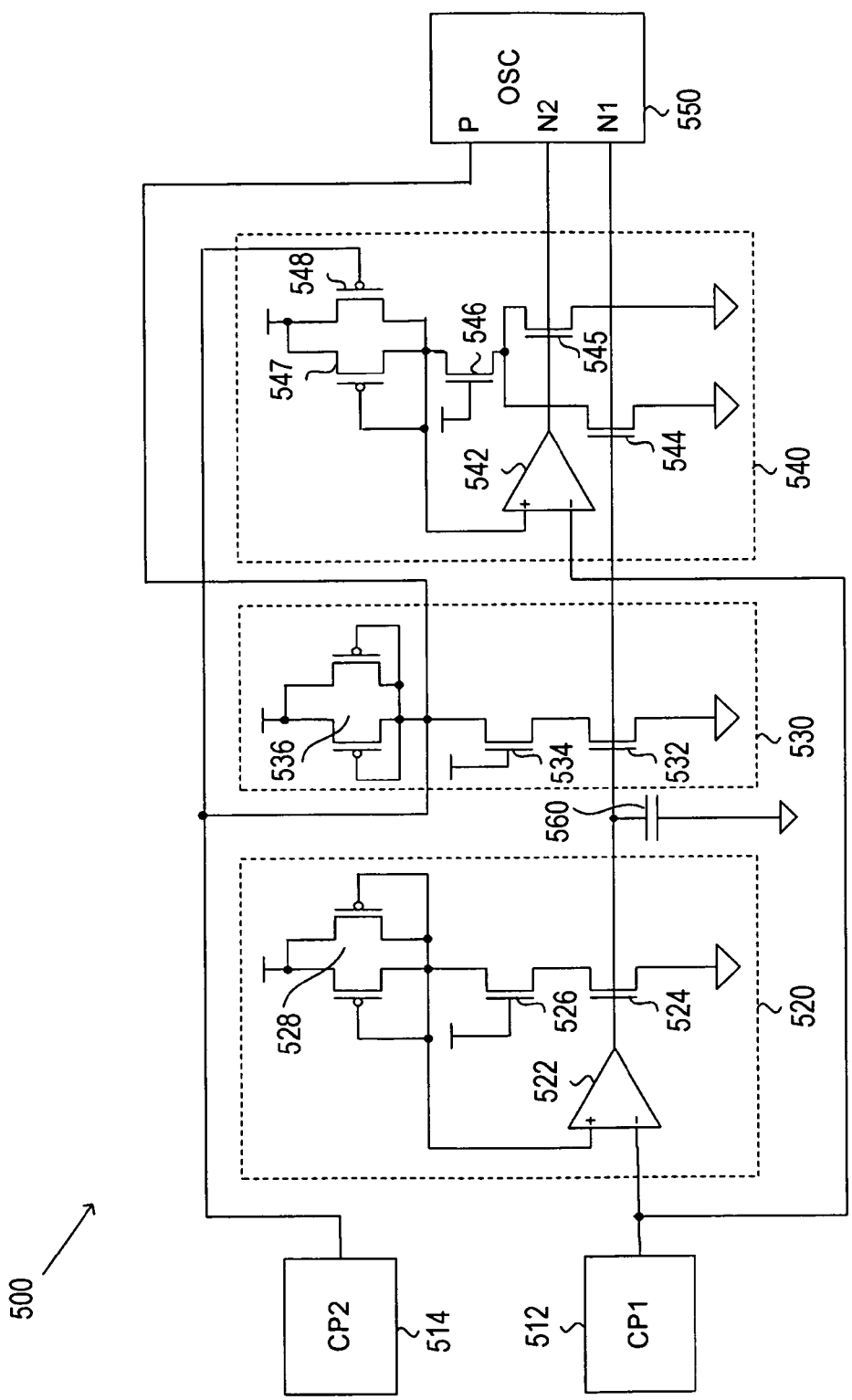
FIG. 5 illustrates a simplified schematic of an example SBPLL for reducing oscillator common mode gain while providing improved stability through the decoupling of a portion of the NBias signal provided to the oscillator, according to one embodiment.

FIG. 5 illustrates a simplified schematic of an example SBPLL 500 for reducing oscillator common mode gain while providing improved stability through the decoupling of a portion of the NBias signal provided to the oscillator. The SBPLL 500 includes an integral charge pump (CP1) 512, a proportional charge pump (CP2) 514, a filter (not illustrated), a first NBias generator 520, a PBias generator 530, a second NBias generator 540 and an oscillator 550.

The first NBias generator 520 include an operational amplifier 522 and transistors 524 and 526 connected in series with a diode 528 (pair of parallel transistors connected as diodes). According to one embodiment, the transistors 524 and 526 may be NMOS FETs and the transistor pair may be PMOS FETs. The integrating control signal from CP1 512 is provided as one input of the operational amplifier 522. A second input of the operational amplifier 522 is an output from the transistors 524, 526, and 528. An output of the amplifier 522 is provided to a gate of the transistor 524. The amplifier output is a biased integrating control signal and is an output of the first NBias generator 520. The output of the first NBias generator 520 may be decoupled using a capacitor 560 to reduce thermal noise. The decoupled first NBias output is provided to an "N1" input of the oscillator 550. The first NBias generator 520 uses only the integral control signal from CP1 512 and does not receive the proportional control signal from CP2 514.

The PBias generator 530 includes transistors 532 and 534 connected in series with a diode 536 (pair of parallel transistors connected as diodes). According to one embodiment, the transistors 532 and 534 may be NMOS FETs and the transistor pair may be PMOS FETs. The NBias output is provided to a gate of the transistor 532. The proportional control signal from the CP2 514 is provided to the PBias generator 530 and may be biased by the transistors 532, 534, and the diode 536. The biased proportional control signal is an output of the PBias generator 530 and is provided to a "P" input of the oscillator 550.

The second NBias generator 540 includes an operational amplifier 542 and transistors 544, 545, 546, 547, 548. The transistor 547 is connected as a diode and the transistor 548 is a coupling transistor. According to one embodiment, the transistors 544, 545 and 546 may be NMOS FETs and the transistors 547 and 548 may be PMOS FETs. The integrating control signal from CP1 512 is provided as one input of the operational amplifier 542. A second input of the operational amplifier 542 is an output from the transistors 544, 545, 546, 547, 548. The decoupled first NBias output is provided to a gate of transistor 544. An output of the amplifier 542 is provided to a gate of the transistor 545. The proportional control signal from the CP2 514 is provided to a gate of transistor 548.

Receiving the proportional control signal provides a modified feedback path from the CP2 514 to the "N2" input of the oscillator 550. The modified feedback reduces the oscillator common mode gain. The proportional control signal is added to the "N2" input of the oscillator 550 in a direction, and with an amplitude, that minimizes the oscillator 550 signal attenuation to stabilize the common mode amplification. The portion of the proportional control signal coupled into the second NBias generator 540 may be determined by a ratio of the number of coupling transistors 548 to the total number of coupling transistors 548 and diode-connected transistors (acting as resistive elements) 547.

The amplifier output is a biased integrating control signal and is an output of the second NBias generator 540. The second NBias output is provided to an "N2" input of the oscillator 550. The combination of the heavily decoupled first NBias output signal with only integral feedback (N1 input) with the a second NBias output signal with integral and proportional feedback simultaneously (N2 input) provides for reduced oscillator common mode gain and improved stability of the oscillator 550 by reducing thermal noise. The SBPLL 500 maximizes decoupling on the first NBias output to combat thermal noise without compromising the loop stability.

Figure 6:
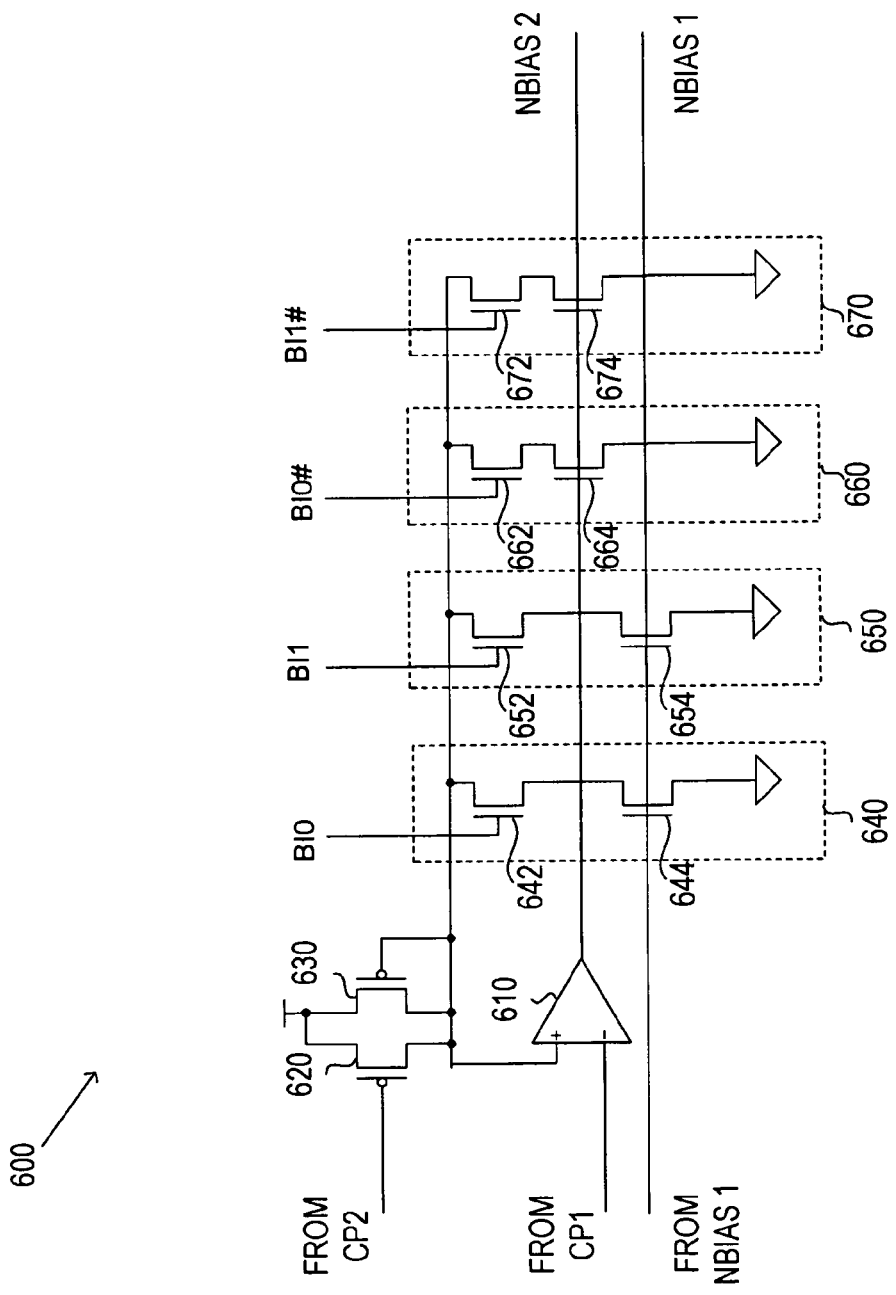
FIG. 6 illustrates an example second NBias generator for varying proportion of the two NBias signals, according to one embodiment.

FIG. 6 illustrates an example second NBias generator 600 (e.g., 540 of FIG. 5) where the proportion of each of the two NBias signals may be varied. The second NBias generator 600 includes an operational amplifier 610 receiving an integrated control signal (from CP1), a coupling transistor 620 receiving a proportional control signal (from CP2), a diode connected transistor 630, and one or more transistor replica stacks 640, 650, 660, 670. Each replica stack 640, 650, 660, 670 include a pair of transistors 642, 644, 652, 654, 662, 664, 672, 674 respectively. The top transistor 642, 652, 662, 672 of each replica stack may be coupled to control inputs BI0, BI1, BI0#, BI1# respectively. The control inputs BI0, BI1, BI0#, BI1# are used to control whether or not the particular stack is switched into the bias generator output circuit. The bottom transistors 644, 654 of the replica stacks 640, 650 are connected to the output of the first NBias generator. The bottom transistors 664, 674 of the replica stacks 660, 670 are connected to the output of the second NBias generator (operational amplifier 610).

By controlling the control inputs BI0, BI1, BI0#, BI1# on each of the control transistors 642, 652, 662, 672, the relative contribution of NBias 1 and Nbias 2 may be varied to achieve a desired balance of common mode gain and improved stability after fabrication. Although two replica stacks are shown connected to each NBias generator, any number of replica stacks may be used for each. A larger number of replica stacks provides for finer control of the two NBias signals provided to the oscillator.

Figure 7:
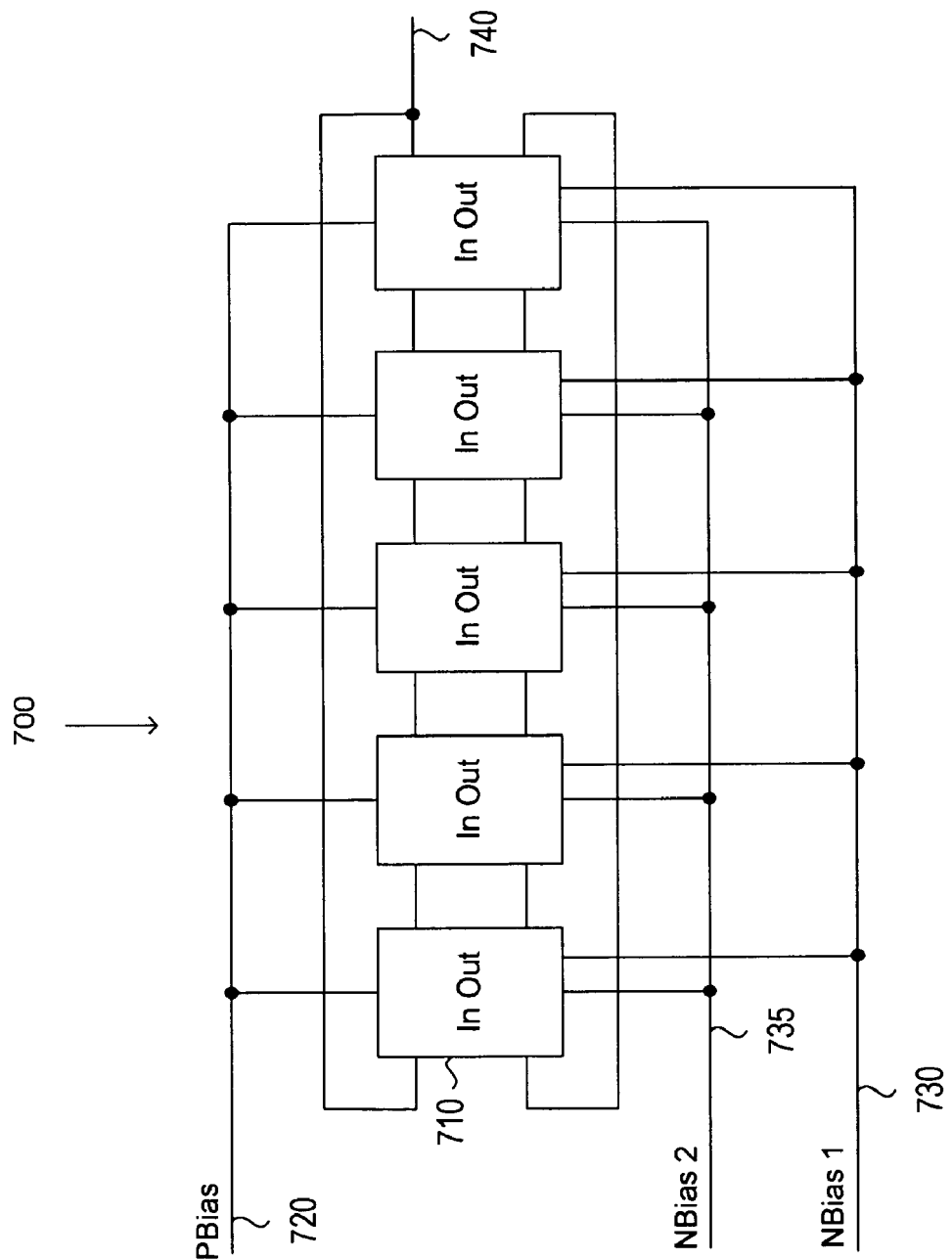
FIG. 7 illustrates an example of a multi-stage oscillator, according to one embodiment.

FIG. 7 illustrates an example VCO oscillator 700 (e.g., 550 of FIG. 5). The oscillator 700 includes a plurality of stages 710 (five stages are illustrated) organized as a ring oscillator. Each stage feeds its output to the input of the succeeding stage, with the output of the final stage feeding back to the input of the first stage. The oscillator receives a PBias input 720 (e.g., from 530 of FIG, 5), an NBias 1 input 730 (e.g., from 520) and an NBias 2 input 735 (e.g., from 540, from 600 of FIG. 6) and provides an output 740.

Figure 8:
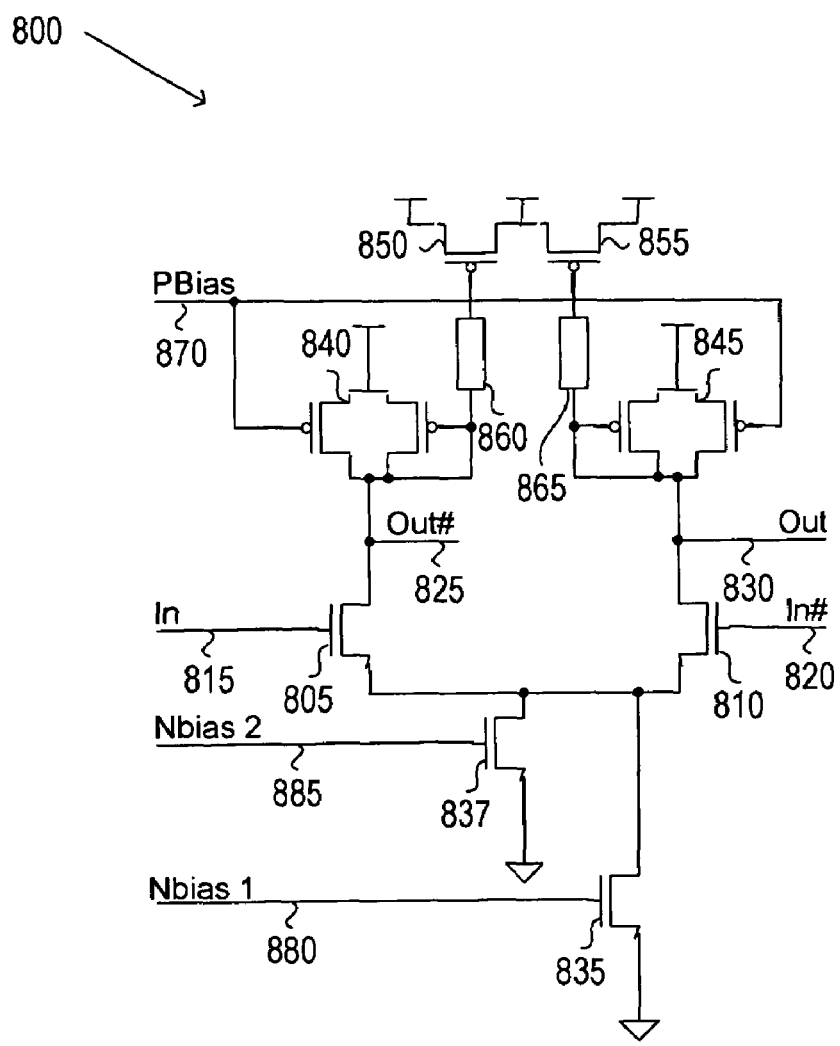
FIG. 8 illustrates an example stage of an oscillator, according to one embodiment.

FIG. 8 illustrates an example oscillator stage 800 (e.g., 710 of FIG. 7). The oscillator stage 800 includes a differential pair of transistors 805, 810, two current source (current tail) transistors 835 and 837, transistor pairs 840 and 845 acting as voltage controlled resistors, transistors 850 and 855 acting as load capacitors, and elements 860 and 865 acting as metal options to provide a means for adjusting, during device fabrication, the maximum frequency of the oscillator. A PBias input 870 is provided to the transistor pairs 840 and 845. An NBias 1 input 880 is provided to the current source transistors 835 and an NBias 2 input 885 is provided to the current source transistor 837. Differential inputs 815 and 820 from a previous oscillator stage are provided to the differential transistor pair 805, 810. Differential outputs 825 and 830 are provided to a next oscillator stage.

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed:

1. A phase-locked loop circuit comprising:
    an oscillator to generate an output frequency, wherein the output frequency generated is controlled by a first control signal, a second control signal, and a third control signal;
    a first charge pump;
    a second charge pump;
    a first bias generator, coupled to the first charge pump, to generate the first control signal;
    a second bias generator, coupled to the first charge pump, the second charge pump, and the first bias generator, to generate the second control signal; and
    a third bias generator, coupled to the second charge pump and the first bias generator, to generate the third control signal.

2. The circuit of claim 1, wherein the first charge pump generates an integrating control signal.

3. The circuit of claim 1, wherein the second charge pump generates a proportional control signal.

4. The circuit of claim 1, further comprising a decoupling circuit coupled between the first bias generator and the oscillator.

5. The circuit of claim 1, wherein the oscillator comprises a plurality of stages.

6. The circuit of claim 5, wherein the first control signal controls a first current source in each stage of the plurality of oscillator stages.

7. The circuit of claim 5, wherein the second control signal controls a second current source in each stage of the plurality of oscillator stages.

8. The circuit of claim 5, wherein the third control signal controls a variable resistance circuit in each stage of the plurality of oscillator stages.

9. A phase-locked loop circuit comprising:
an oscillator to generate an output frequency, wherein the output frequency generated is controlled by a first control signal, a second control signal, and a third control signal;
a first charge pump;
a second charge pump;
a first bias generator, coupled to the first charge pump, to generate the first control signal;
a second bias generator, coupled to the first charge pump, the second charge pump, and the first bias generator, to generate the second control signal, wherein the second bias generator includes
an amplifier having an inverting input, a non-inverting input and an output, wherein the inverting input of the amplifier receives electrical input from the first charge pump;
a first transistor coupled to the output of the amplifier;
a second transistor, connected in parallel with the first transistor, wherein the second transistor receives electrical input from the first bias generator;
a third transistor coupled to the first transistor and the second transistor and to the non-inverting input of the amplifier;
a fourth transistor coupled to the third transistor and the non-inverting input of the amplifier; and
a fifth transistor, connected in parallel with the fourth transistor, wherein the fifth transistor receives electrical input from the second charge pump; and
a third bias generator, coupled to the second charge pump and the first bias generator, to generate the third control signal.

10. The circuit of claim 9, wherein the first, second, and third transistors are NMOS FETs and the fourth and fifth transistors are PMOS FETs.

11. The circuit of claim 9, wherein the fourth transistor and the fifth transistor cooperate to attenuate the electrical input received from the second charge pump.

12. The circuit of claim 1, wherein proportion of the first control signal and the second control signal applied to the oscillator can be varied using control signals.

13. A phase-locked loop circuit comprising:
an oscillator to generate an output frequency, wherein the output frequency generated is controlled by a first control signal, a second control signal, and a third control signal;
a first charge pump;
a second charge pump;
a first bias generator, coupled to the first charge pump, to generate the first control signal;
a second bias generator, coupled to the first charge pump, the second charge pump, and the first bias generator, to generate the second control signal, wherein the second bias generator includes
an amplifier having an inverting input, a non-inverting input and an output, wherein the inverting input of the amplifier receives electrical input from the first charge pump;
at least one first pair of transistors in series, wherein a first transistor of the at least one first pair of transistors in series is coupled to the output of the amplifier and a second transistor of the at least one first pair of transistors in series is coupled to the first transistor of the at least one first pair of transistors in series and to the non-inverting input of the amplifier;
at least one second pair of transistors in series, wherein a first transistor of the at least one second pair of transistors in series receives electrical input from the first bias generator and a second transistor of the at least one second pair of transistors in series is coupled to the first transistor of the at least one second pair of transistors in series and to the non-inverting input of the amplifier;
a diode-connected transistor coupled to the non-inverting input of the amplifier; and
a coupling transistor, connected in parallel with the diode-connected transistor, wherein the coupling transistor receives the electrical input from the second charge pump; and
a third bias generator, coupled to the second charge pump and the first bias generator, to generate the third control signal.

14. The circuit of claim 13, wherein proportion of the first control signal and the second control signal applied to the oscillator can be varied by applying at least one control signal to the second transistor of the at least one first pair of transistors in series and at least one compliment control signal to the second transistor of the at least one second pair of transistors in series.

15. A phase-locked loop circuit comprising:
an oscillator to generate an output frequency based on control signals;
a charge pump to generate an integrating control signal and a proportional control signal; and
a bias generator to generate and provide to the oscillator a first biased integrating control signal, a second biased integrating control signal, and a biased proportional control signal, wherein the first biased integrating control signal is generated based on the integrating control signal and may be decoupled, the second integrating control biased signal is generated based on the integrating control signal and the proportional control signal, and the biased proportional control signal is generated based on the proportional control signal and the first biased integrating control signal.

16. The circuit of claim 15, wherein the first biased integrating control signal controls a first oscillator current source, the second biased integrating control signal controls a second oscillator current source, and the biased proportional control signal controls a variable resistance circuit in the oscillator.

17. The circuit of claim 15, wherein generating the first biased integrating control signal without regard to the proportional control signal enables the first biased integrating control signal to be decoupled to reduce noise without compromising loop stability.

18. The circuit of claim 15, wherein generating the second biased integrating control signal based on the integrating control signal and the proportional control signal reduces common mode gain of the oscillator.

19. A method comprising:
applying an output of a first charge pump to an input of a first bias generator and to a first input of a second bias generator;
applying an output of a second charge pump to a first input of a third bias generator and a second input of the second bias generator;

applying an output of the first bias generator to a first input of the oscillator, a third input of the second bias generator, and a second input of the third bias generator;

applying an output of the second bias generator to a second input of the oscillator; and applying an output of the third bias generator to a third input of the oscillator.

20. The method of claim 19, further comprising decoupling the output of the first bias generator.

21. The method of claim 19, further comprising variably proportioning the output of the first bias generator and the output of the second bias generator.

22. A computer comprising:

a microprocessor die including:

an oscillator to generate an output frequency, wherein the output frequency generated is controlled by a first control signal, a second control signal, and a third control signal;

a first charge pump;

a second charge pump;

a first bias generator, coupled to the first charge pump, to generate the first control signal;

a second bias generator, coupled to the first charge pump, the second charge pump, and the first bias generator, to generate the second control signal; and a third bias generator, coupled to the second charge pump and the first bias generator, to generate the third control signal; and an off-die memory device.

23. The computer of claim 22, further comprising a decoupling circuit connected between the first bias generator and the oscillator.

24. The computer of claim 22, wherein proportion of the first control signal and the second control signal applied to the oscillator can be varied using control signals.

* * * * *